(12) United States Patent
Li et al.

(10) Patent No.: US 11,605,591 B2
(45) Date of Patent: Mar. 14, 2023

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Shu-Wei Li, Hsinchu (TW); Guanyu Luo, Hsinchu (TW); Shin-Yi Yang, New Taipei (TW); Ming-Han Lee, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 163 days.

(21) Appl. No.: 17/217,016

(22) Filed: Mar. 30, 2021

(65) Prior Publication Data

US 2022/0319989 A1 Oct. 6, 2022

(51) Int. Cl.
*H01L 23/528* (2006.01)
*H01L 23/522* (2006.01)
*H01L 21/768* (2006.01)
*H01L 23/532* (2006.01)

(52) U.S. Cl.
CPC ........... *H01L 23/5283* (2013.01); *H01L 21/76843* (2013.01); *H01L 23/5225* (2013.01); *H01L 23/5226* (2013.01); *H01L 23/53238* (2013.01)

(58) Field of Classification Search
CPC ........... H01L 23/5283; H01L 21/76843; H01L 23/5225; H01L 23/5226; H01L 23/53238
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2009/0302473 A1* | 12/2009 | Shibata | H01L 23/5222 438/618 |
| 2020/0027830 A1* | 1/2020 | Li | H01L 21/32115 |

\* cited by examiner

*Primary Examiner* — Karen Kusumakar
(74) *Attorney, Agent, or Firm* — NZ Carr Law Office

(57) ABSTRACT

An interconnection structure, along with methods of forming such, are described. The structure includes a dielectric material and a conductive feature extending through the dielectric material. The conductive feature includes a conductive material and has a first top surface. The structure further includes a dummy conductive feature disposed adjacent the conductive feature in the dielectric material, and the dummy conductive feature has a second top surface substantially co-planar with the first top surface. An air gap is formed in the dummy conductive feature.

20 Claims, 13 Drawing Sheets

SEMICONDUCTOR DEVICE STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. With decreasing semiconductor device dimensions, improved semiconductor devices with improved sheet resistance, contact resistance, and capacitance are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
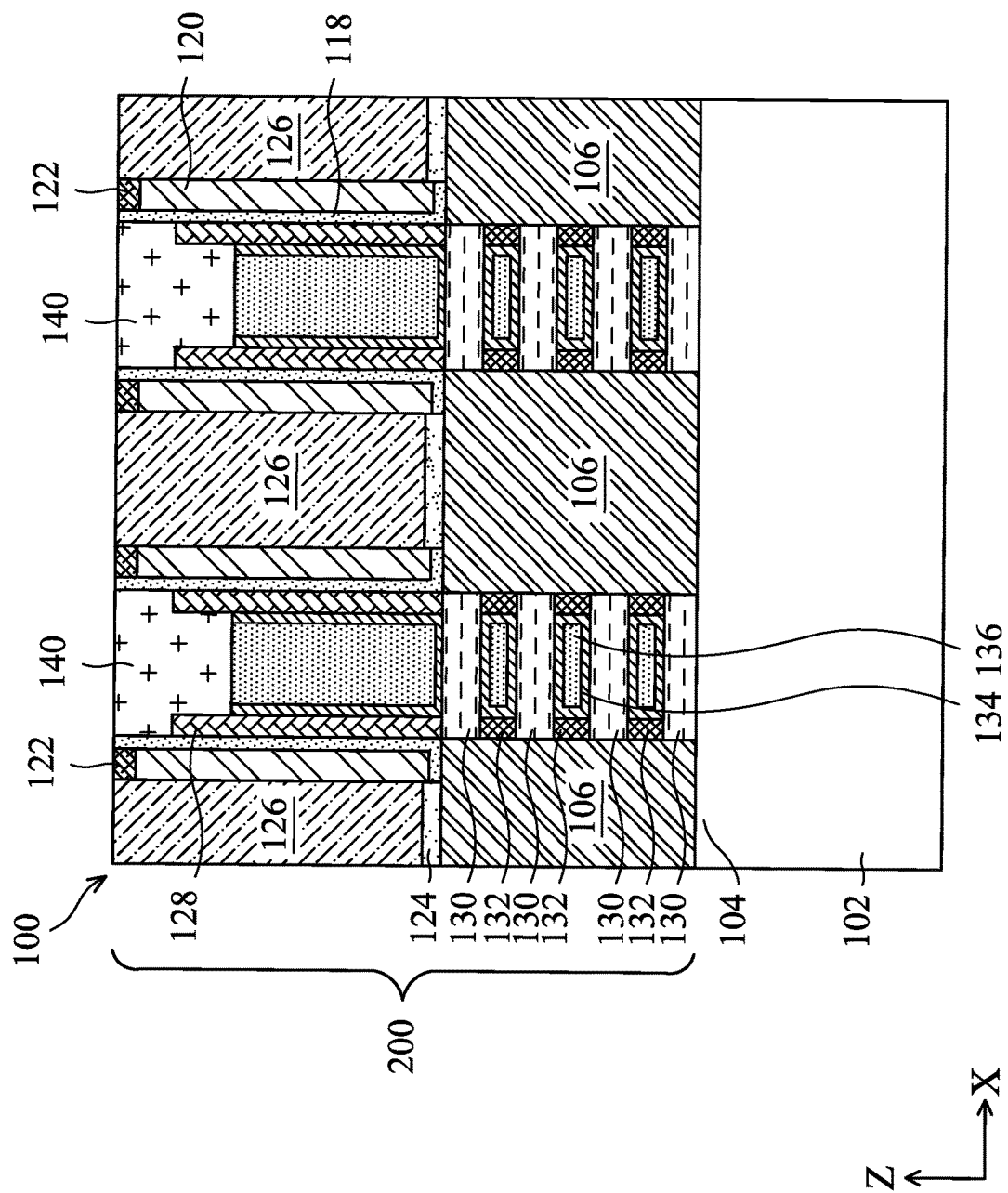
FIG. 1 is a cross-sectional side view of a stage of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a stage of manufacturing a semiconductor device structure 100. As shown in FIG. 1, the semiconductor device structure 100 includes a substrate 102 having substrate portions 104 extending therefrom and source/drain (S/D) epitaxial features 106 disposed over the substrate portions 104. The substrate 102 may be a semiconductor substrate, such as a bulk silicon substrate. In some embodiments, the substrate 102 may be an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; other suitable materials; or combinations thereof. Possible substrates 102 also include a silicon-on-insulator (SOI) substrate. SOI substrates are fabricated using separation by implantation of oxygen (SIMOX), wafer bonding, and/or other suitable methods. The substrate portions 104 may be formed by recessing portions of the substrate 102. Thus, the substrate portions 104 may include the same material as the substrate 102. The substrate 102 and the substrate portions 104 may include various regions that have been suitably doped with impurities (e.g., p-type or n-type impurities). The dopants are, for example boron for a p-type field effect transistor (PFET) and phosphorus for an n-type field effect transistor (NFET). The S/D epitaxial features 106 may include a semiconductor material, such as Si or Ge, a III-V compound semiconductor, a II-VI compound semiconductor, or other suitable semiconductor material. Exemplary S/D epitaxial features 106 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D epitaxial features 106 may include p-type dopants, such as boron; n-type dopants, such as phosphorus or arsenic; and/or other suitable dopants including combinations thereof.

As shown in FIG. 1, S/D epitaxial features 106 may be connected by one or more semiconductor layers 130, which may be channels of a FET. In some embodiments, the FET is a nanostructure FET including a plurality of semiconductor layers 130, and at least a portion of each semiconductor layer 130 is wrapped around by a gate electrode layer 136. The semiconductor layer 130 may be or include materials such as Si, Ge, SiC, GeAs, GaP, InP, InAs, InSb, GaAsP, AlInAs, AlGaAs, InGaAs, GaInP, GaInAsP, or other suitable material. In some embodiments, each semiconductor layer 130 is made of Si. The gate electrode layer 136 includes one or more layers of electrically conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. In some embodiments, the gate electrode layer 136 includes a metal. A gate dielectric layer 134 may be disposed between the gate electrode layer 136 and the semiconductor layers 130. The gate dielectric layer 134 may include two or more layers, such as an interfacial layer and a high-k dielectric layer. In some embodiments, the interfacial layer is an oxide layer, and the high-k dielectric layer includes hafnium oxide ($HfO_2$), hafnium silicate (Hf- SiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), hafnium dioxide-alumina ($HfO_2$—$Al_2O_3$) alloy, or other suitable high-k materials.

The gate dielectric layer 134 and the gate electrode layer 136 may be separated from the S/D epitaxial features 106 by inner spacers 132. The inner spacers 132 may include a dielectric material, such as SiON, SiCN, SiOC, SiOCN, or SiN. Spacers 128 may be disposed over the plurality of semiconductor layers 130. The spacers 128 may include a dielectric material such as silicon oxide, silicon nitride, silicon carbide, silicon oxynitride, SiCN, silicon oxycarbide, SiOCN, and/or combinations thereof. In some embodiments, a self-aligned contact (SAC) layer 140 is formed over the spacers 128, the gate dielectric layer 134, and the gate electrode layer 136, as shown in FIG. 1. The SAC layer 140 may include any suitable material such as SiO, SiN, SiC, SiON, SiOC, SiCN, SiOCN, AlO, AlON, ZrO, ZrN, or combinations thereof.

A contact etch stop layer (CESL) 118 and an interlayer dielectric (ILD) layer 120 are disposed over the S/D epitaxial features 106, as shown in FIG. 1. The CESL 118 may include an oxygen-containing material or a nitrogen-containing material, such as silicon nitride, silicon carbon nitride, silicon oxynitride, carbon nitride, silicon oxide, silicon carbon oxide, the like, or a combination thereof. The materials for the ILD layer 120 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A cap layer 122 may be disposed on the ILD layer 120, and the cap layer 122 may include a nitrogen-containing material, such as SiCN.

Conductive contacts 126 may be disposed in the ILD layer 120 and over the S/D epitaxial features 106, as shown in FIG. 1. The conductive contacts 126 may include one or more electrically conductive material, such as Ru, Mo, Co, Ni. W, Ti, Ta, Cu, Al, TiN and TaN. Silicide layers 124 may be disposed between the conductive contacts 126 and the S/D epitaxial features 106.

As shown in FIG. 1, the semiconductor device structure 100 may include the substrate 102 and a device layer 200 disposed over the substrate 102. The device layer 200 may include one or more devices, such as transistors, diodes, imaging sensors, resistors, capacitors, inductors, memory cells, combinations thereof, and/or other suitable devices. In some embodiments, the device layer 200 includes transistors, such as nanostructure transistors having a plurality of channels wrapped around by the gate electrode layer, as described above. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The channel(s) of the semiconductor device structure 100 may be surrounded by the gate electrode layer. The nanostructure transistors may be referred to as nanosheet transistors, nanowire transistors, gate-all-around (GAA) transistors, multi-bridge channel (MBC) transistors, or any transistors having the gate electrode layer surrounding the channels. In some embodiments, the device layer 200 includes devices such as planar FET, FinFET, complementary FET (CFET), forksheet FET, or other suitable devices.

Figure 2:
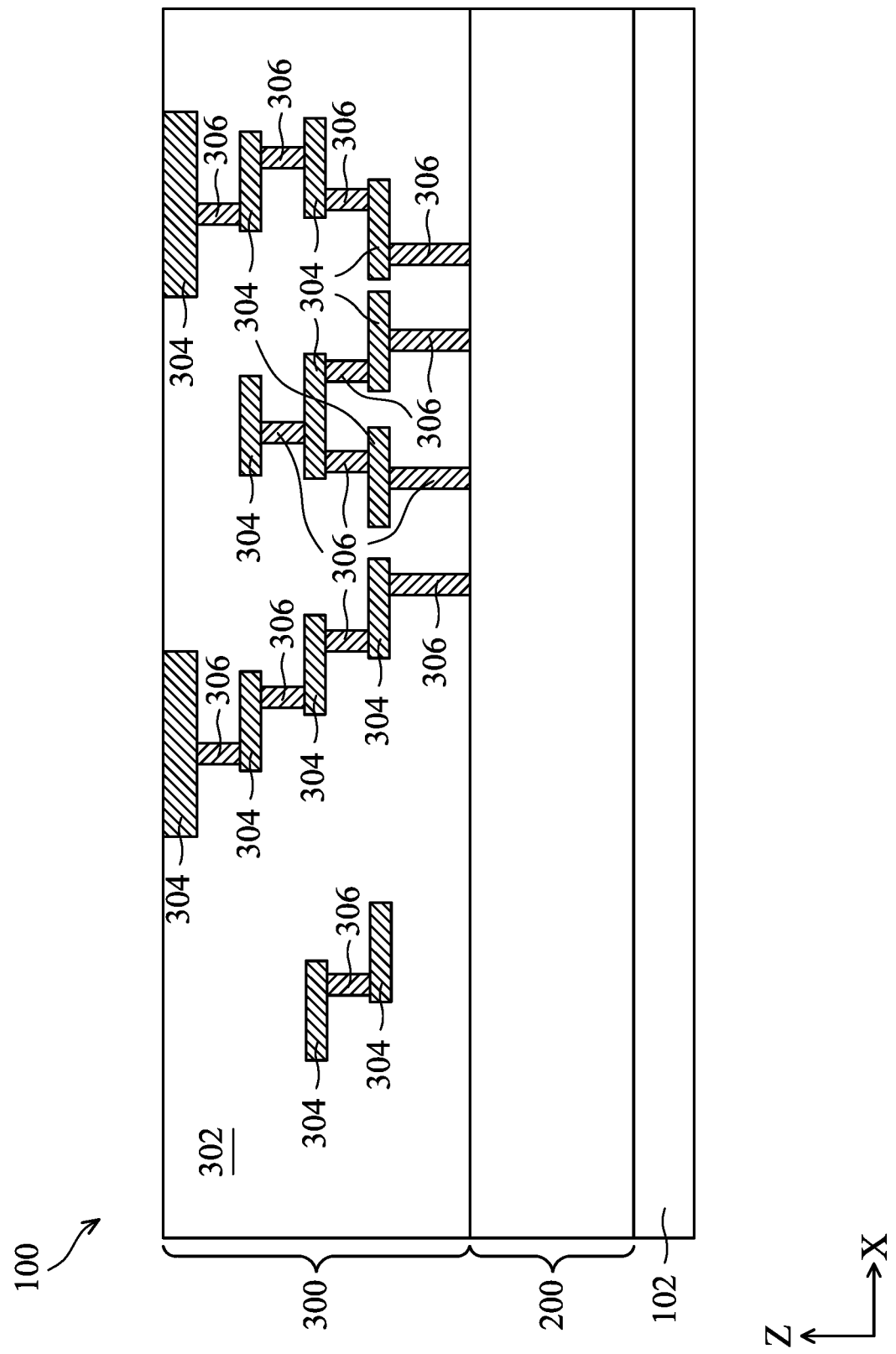
FIG. 2 is a cross-sectional side view of a stage of manufacturing the semiconductor device structure, in accordance with some embodiments.

The semiconductor device structure 100 may further include an interconnection structure 300 disposed over the device layer 200 and the substrate 102, as shown in FIG. 2. The interconnection structure 300 includes various conductive features, such as a first plurality of conductive features 304 and second plurality of conductive features 306, and an intermetal dielectric (IMD) layer 302 to separate and isolate various conductive features 304, 306. In some embodiments, the first plurality of conductive features 304 are conductive lines and the second plurality of conductive features 306 are conductive vias. The interconnection structure 300 includes multiple levels of the conductive features 304, and the conductive features 304 are arranged in each level to provide electrical paths to various devices in the device layer 200 disposed below. The conductive features 306 provide vertical electrical routing from the device layer 200 to the conductive features 304 and between conductive features 304. For example, the bottom-most conductive features 306 of the interconnection structure 300 may be electrically connected to the conductive contacts 126 (FIG. 1) and the gate electrode layer 136 (FIG. 1). The conductive features 304 and conductive features 306 may be made from one or more electrically conductive materials, such as metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as $SiO_x$, $SiO_xC_yH_z$, or $SiO_xC_y$, where x, y and z are integers or non-integers. In some embodiments, the IMD layer 302 includes a low-k dielectric material having a k value less than that of silicon oxide.

Figure 3A:
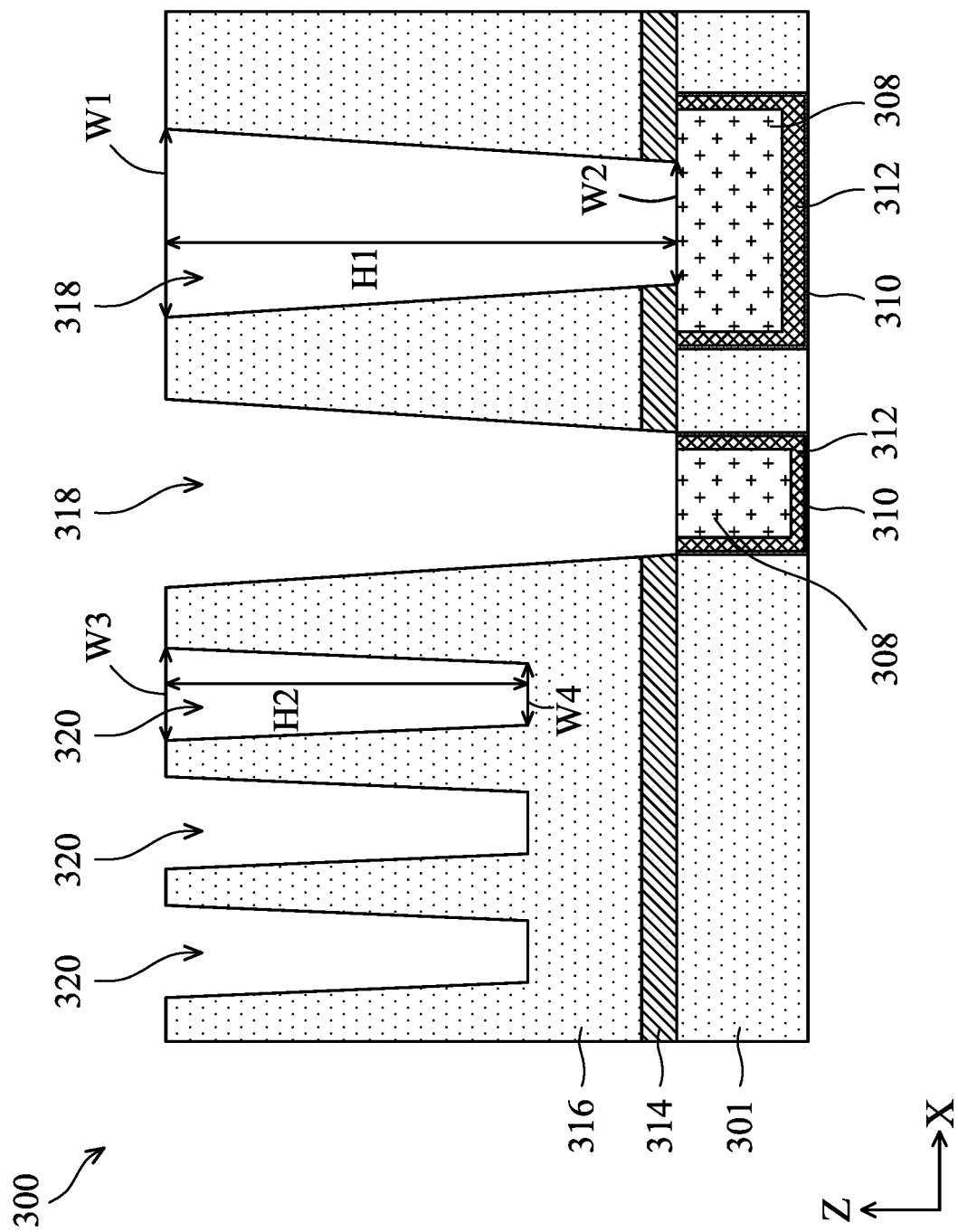
FIGS. 3A-3E are cross-sectional side views of various stages of manufacturing the interconnection structure, in accordance with some embodiments.

FIGS. 3A-3E are cross-sectional side views of various stages of manufacturing the interconnection structure 300, in accordance with some embodiments. As shown in FIG. 3A, the interconnection structure 300 includes a dielectric material 301, which may be an ILD layer or an IMD layer. For example, the dielectric material 301 may be SiCOH and has a k value ranging from about 2.5 to about 3. In some embodiments, the dielectric material 301 may be disposed over the ILD layer 120 (FIG. 1). The dielectric material 301 may include an oxygen-containing material, such as silicon oxide or fluorine-doped silicate glass (FSG); a nitrogen-containing material, such as silicon nitride, silicon oxynitride (SiON), SiOCN, SiCN; a low-k dielectric material (e.g., a material having a k value lower than that of the silicon oxide); a carbon-containing material, such as SiC, SiOC, or any suitable dielectric material. The dielectric material 301 may be formed by chemical vapor deposition (CVD), atomic layer deposition (ALD), spin-on, physical vapor deposition (PVD) or other suitable process. In some embodiments, the dielectric material 301 may be a dielectric layer of the IMD layer 302.

The dielectric material 301 may include one or more conductive features 308 disposed therein. The one or more conductive features 308 may be electrically connected to the S/D epitaxial features 106 (FIG. 1) and the gate electrode layer 136 (FIG. 1). In some embodiments, the conductive features 308 are the conductive features 304 or conductive features 306 shown in FIG. 2. The conductive feature 308 may include an electrically conductive material, such as Cu, Co, W, Ru, Mo, Zn, alloys thereof, or combinations thereof. The conductive feature 308 may be formed by any suitable process, such as PVD. In some embodiments, a barrier layer 310 may be formed between the dielectric material 301 and the conductive feature 308, and a liner 312 may be formed between the barrier layer 310 and the conductive feature 308. The barrier layer 310 may include Ta, Ti, Mn, Zn, In, TaN, TiN, two-dimensional (2D) material, or other suitable material. The term "2D material" used in this disclosure refers to single layer material or monolayer-type material that is atomically thin crystalline solid having intralayer covalent bonding and interlayer van der Waals bonding. Examples of a 2D material may include graphene, hexagonal boron nitride (h-BN), or transition metal dichalcogenides ($MX_2$), where M is a transition metal element and X is a chalcogenide element. Some exemplary $MX_2$ materials may include, but are not limited to Hf, $Te_2$, $WS_2$, $MoS_2$, $WSe_2$, $MoSe_2$, or any combination thereof. The barrier layer 310 may prevent the metal diffusion from the conductive feature 308 to the dielectric material 301. In some embodiments, the conductive feature 308 includes a metal that is not susceptible to diffusion, and the barrier layer 310 may be omitted.

The liner 312 may include Co, Ru, Mn, Zn, Zr, W, Mo, Os, Jr, Al, Fe, Ni, alloys thereof, or combinations thereof. The liner 312 may be omitted in some embodiments, and the conductive feature 308 may be in contact with the barrier layer 310. The barrier layer 310 and the liner 312 may each have a thickness ranging from about 3 Angstroms to about 100 Angstroms. Because the barrier layer 310 and the liner 312 may include an electrically conductive material, the contacting area for a subsequently formed conductive feature 326 (FIG. 3D) may be increased.

As shown in FIG. 3A, an etch stop layer 314 and a dielectric material 316 are formed over a dielectric material 301. The etch stop layer 314 may be made of a material having different etch selectivity compared to the dielectric material 316. In some embodiments, the etch stop layer 314 is made of a dielectric material, such as a metal oxide, a metal nitride, a silicon nitride, or other suitable material. The etch stop layer 314 may be formed by any suitable process, such as CVD, ALD, PVD, PEALD, or PECVD. The dielectric material 316 may include the same material as the dielectric material 301 and may be formed by the same process as the dielectric material 301. Openings 318, 320 are formed in the dielectric material 316. The openings 318 may be formed through the dielectric material 316, and the openings 320 are formed in the dielectric material 316. Each opening 318 may have a width W1 ranging from about 30 Angstroms to about 1400 Angstroms at the top of the opening 318 and a width W2 ranging from about 10 Angstroms to about 500 Angstroms at the bottom of the opening 318. Each opening 318 may have a height H1 ranging from about 20 Angstroms to about 3000 Angstroms, such as from about 20 Angstroms to about 300 Angstroms. The openings 318 may have the same dimensions or different dimensions. The openings 318 expose the conductive features 308, and the subsequently formed conductive features 326 (FIG. 3D) in the openings 318 may be electrically connected to the conductive features 308, which may be electrically connected to the devices in the device layer 200 (FIG. 2).

Each opening 320 may have a width W3 ranging from about 5 Angstroms to about 425 Angstroms, at the top of the opening 320 and a width W4 ranging from about 3 Angstroms to about 415 Angstroms at the bottom of the opening 320. Each opening 320 may have a height H2 ranging from about 10 Angstroms to about 2500 Angstroms. In some embodiments, the height H2 is about 50 percent to about 85 percent of the height H1. The openings 320 may have the same dimensions or different dimensions. Subsequently formed dummy conductive features 328 (FIG. 3D) in the openings 320 may be dummy conductive features. The dummy conductive features 328 (FIG. 3D) are not electrically connected to any conductive features or devices in the device layer 200 (FIG. 2), and the dummy conductive features 328 (FIG. 3D) are not formed for the purpose of electric routing. Instead, the dummy conductive features 328 (FIG. 3D) are utilized to balance the ratio of the dielectric material to the conductive features, so the planarity of the dielectric material 316 may be improved. Unlike traditional openings for dummy conductive features, which may have the same or larger dimensions than the openings for conductive features for electric routing, the openings 320 have smaller dimensions than the openings 318. In some embodiments, the openings 318, 320 are formed by the same patterning and etching processes. In some embodiments, additional patterning and etching processes may be performed to form the openings 320 due to the smaller dimensions of the openings 320.

Figure 3B:
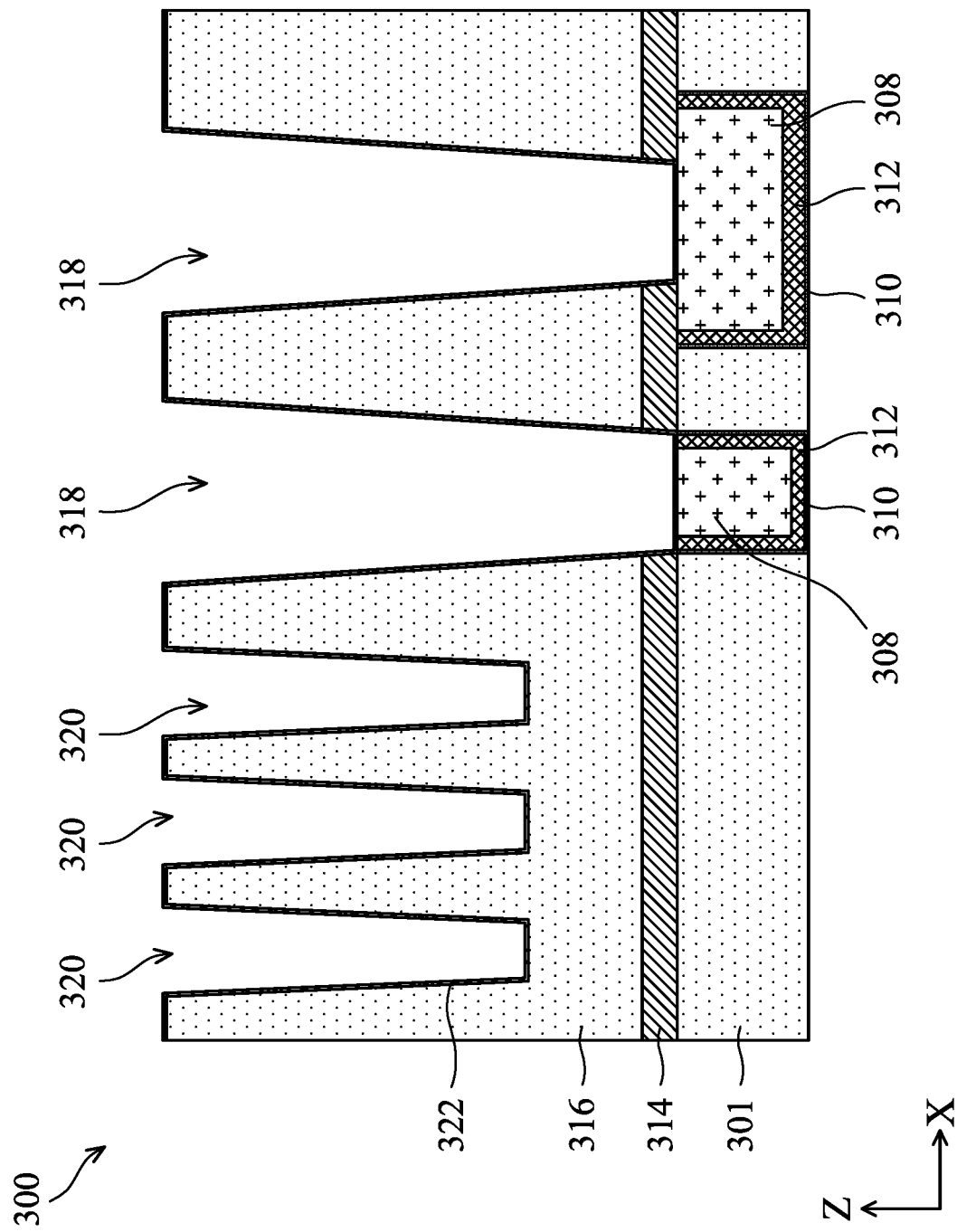

As shown in FIG. 3B, a barrier layer 322 is formed in each opening 318, 320. The barrier layer 322 may include the same material as the barrier layer 310 and may be formed by a conformal process, such as ALD. The term "conformal" may be used herein for ease of description upon a layer having substantial same thickness over various regions. In some embodiments, the barrier layer 322 is formed in the openings 318, 320 by a deposition process, such as an ALD process. The barrier layer 322 may have a thickness ranging from about 3 Angstrom to about 100 Angstroms, such as from about 3 Angstroms to about 50 Angstroms.

Figure 3C:
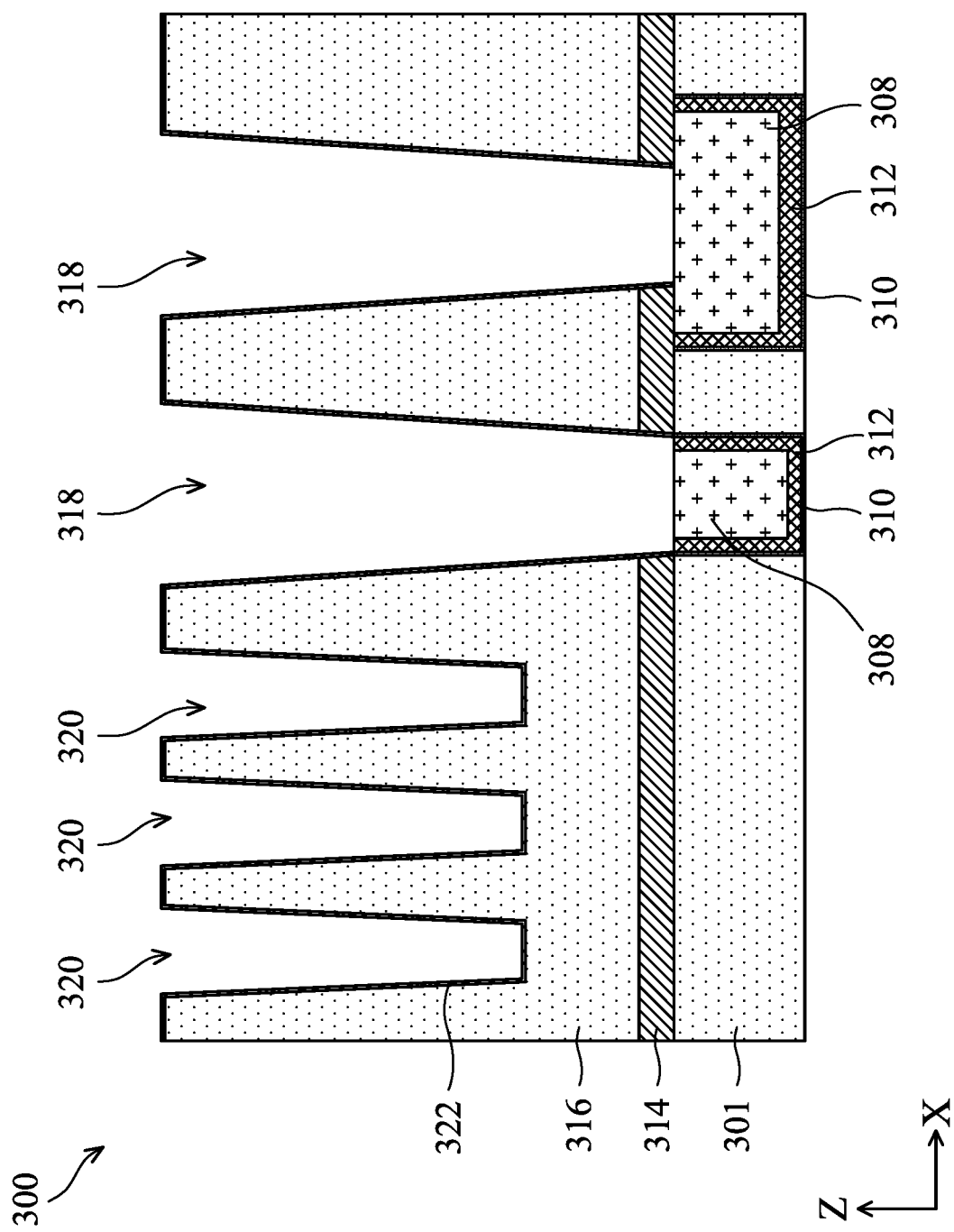

In some embodiments, the barrier layer 322 is not formed on the surfaces of the conductive features 308, the barrier layers 310, and the liners 312, as shown in FIG. 3C. Prior to the formation of the barrier layer 322, a blocking layer (not shown) may be selectively formed on the metallic surfaces of the conductive features 308, the barrier layers 310, and the liners 312. For example, the blocking layer may include one or more self-assembled monolayers (SAMs) of a blocking compound having a head group and a tail group. In some embodiments, the head group of the blocking compound includes sulfur, such as thiol, and/or phosphorus, such as phosphonic acid. The head group of the blocking compound may only attach to the metallic surfaces of the conductive features 308, the barrier layers 310, and the liners 312, and may not form on the dielectric surface of the dielectric material 316 and the etch stop layer 314. The tail group of the blocking compound may include a highly hydrophobic long alkyl chain which blocks adsorption of a precursor (e.g., the precursor for forming the barrier layer 322) from forming on the blocking layer. In some embodiments, the tail group includes a polymer such as polyimide. With the blocking layer formed on the metallic surfaces of the conductive features 308, the barrier layers 310, and the liners 312, the barrier layer 322 is selectively formed on the dielectric material 316 and the etch stop layer 314 and not formed on the blocking layer. After the formation of the barrier layer 322, the blocking layer may be removed by any suitable process, such as a plasma or thermal process. The removal of the blocking layer does not substantially affect the exposed materials of the interconnection structure 300.

Figure 3D:
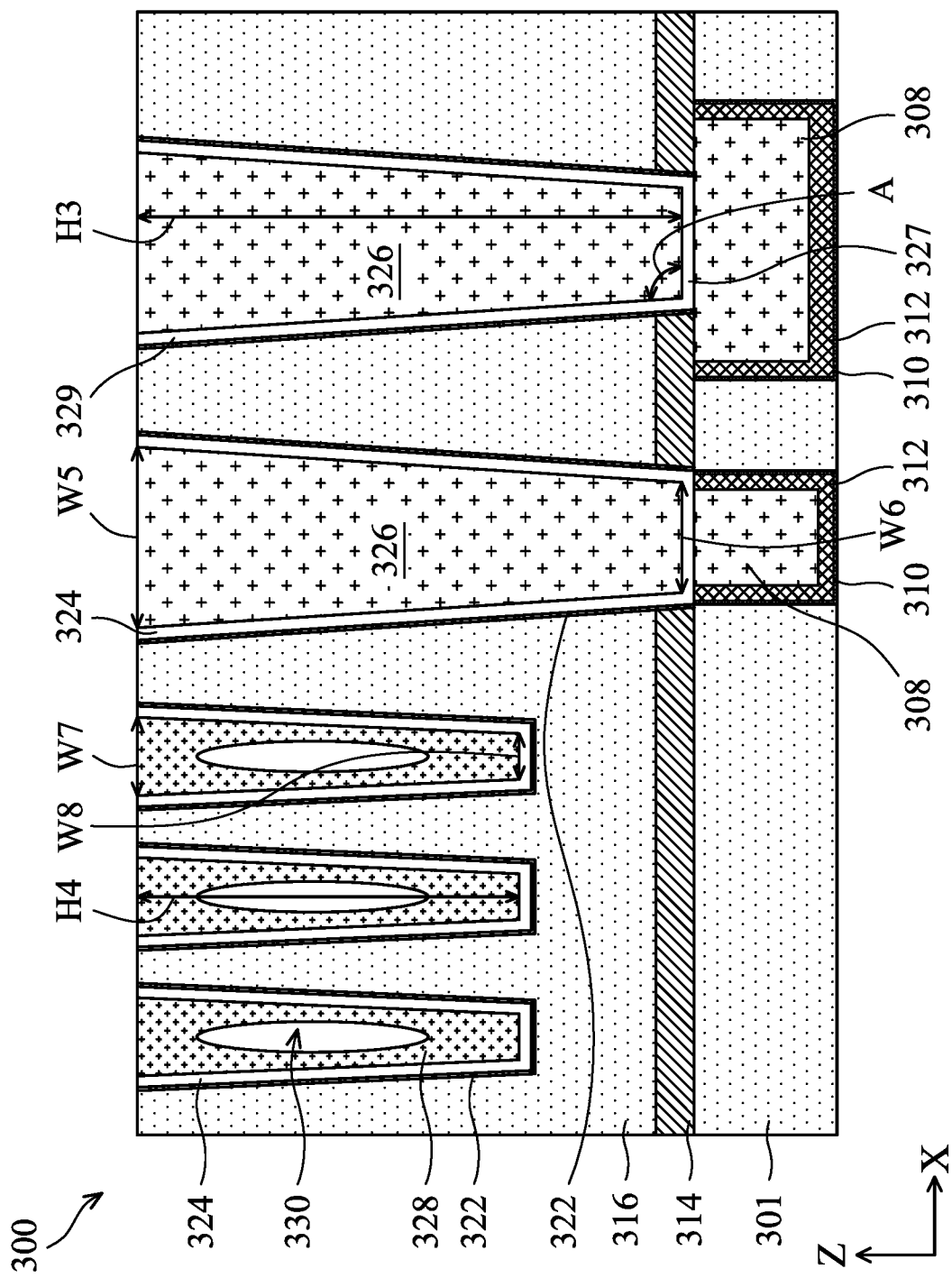

As shown in FIG. 3D, a liner 324 is formed on the barrier layer 322 in each opening 318, 320, conductive features 326 are formed in the openings 318, and dummy conductive features 328 are formed in the openings 320. The liner 324 may include the same material as the liner 312 and may be formed by a conformal process, such as ALD. In some embodiments, the liner 324 is formed in the openings 318, 320 by a deposition process, such as an ALD process. The liner 324 may have a thickness ranging from about 3 Angstrom to about 100 Angstroms, such as from about 3 Angstroms to about 50 Angstroms.

The conductive features 326 may be formed through the dielectric material 316, and the dummy conductive features 328 may be formed in the dielectric material 316. In some embodiments, the conductive features 326 and the dummy conductive features 328 each includes an electrically conductive material, such as Cu, Co, W, Ru, Mo, Zn, alloys thereof, or combinations thereof. The conductive features 326 and the dummy conductive features 328 may be formed by a single PVD process. The material of the conductive feature 326 fills the opening 318 when formed by the PVD process due to the larger width W1 at the top of the openings 318. However, the material of the dummy conductive feature 328 does not completely fill the openings 320 when formed by the PVD process due to the small width W3 at the top of the openings 320. As a result, air gaps 330 are formed in the dummy conductive features 328 but not in the conductive features 326, as shown in FIG. 3D. For conductive features 326, which are utilized for electrical routing, air gaps are to be avoided because air gaps lead to poor electrical conduction. However, for dummy conductive features 328, air gaps 330 formed therein may lead to reduced capacitance. Furthermore, the total capacitance of back-end-of-line (BEOL) may be tuned by purposely forming air gaps 330 in the dummy conductive features 328. The air gap 330 formed in the dummy conductive feature 328 may have a volume ranging from about 5 percent to about 95 percent of a volume of the dummy conductive feature 328. As shown in FIG. 3D, in some embodiments, one or more conductive features 326 are disposed adjacent one or more dummy conductive features 328, and the conductive features 326 each includes a solid (i.e., air-gap free) conductive material while the dummy conductive features 328 each include a conductive material having one or more air gaps 330 formed therein. The conductive feature 326 may have an aspect ratio ranging from about 1 to about 35.

The conductive feature 326 may include a top width W5 ranging from about 30 Angstroms to about 1000 Angstrom and a bottom width W6 ranging from about 10 Angstroms to about 100 Angstroms. The dummy conductive feature 328 may include a top width W7 ranging from about 5 Angstroms to about 25 Angstroms and a bottom width W8 ranging from about 3 Angstroms to about 15 Angstroms. In some embodiments, the top width W7 is about 10 percent to about 50 percent of the top width W5. In some embodiments, the conductive feature 326 has a height H3 ranging from about 20 Angstroms to about 2800 Angstroms. The dummy conductive feature 328 has a height H4 ranging from about 10 Angstroms to about 2100 Angstroms. In some embodiments, the height H4 is about 50 percent to about 85 percent of the height H3. Both the conductive feature 326 and the dummy conductive feature 328 may have the aspect ratio ranging from about 1 to about 35. Due to the small width W3 at the top of the opening 320 (FIG. 3C) and the small top width W7 of the dummy conductive feature 328, the air gap 330 is formed in the dummy conductive feature 328 while no air gap is formed in the conductive feature 326 due to the large width W1 at the top of the opening 318 (FIG. 3C) and the large top width W5 of the conductive feature 326.

The conductive feature 326 includes a bottom 327 and a sidewall 329. In some embodiments, the barrier layer 322 is not formed on the conductive feature 308, and the bottom 327 of the conductive feature 326 is in contact with the liner 324, which is in contact with the conductive feature 308 disposed therebelow. Without the barrier layer 322 formed between the liner 324 and the conductive feature 308, contact resistance may be reduced. In some embodiments, the barrier layer 322 is formed on the conductive feature 308, and the bottom 327 of the conductive feature 326 is in contact with the liner 324, which is in contact with the barrier layer 322, which is in contact with the conductive feature 308 formed therebelow. In some embodiments, the liner 324 is not present, and the bottom 327 of the conductive feature 326 may be in contact with the barrier layer 322 or with the conductive feature 308 formed therebelow. The bottom 327 and the sidewall 329 may form an angle A. The angle A may range from about 90 degrees to about 165 degrees. The angle A may be defined by the shape of the opening 318, which may be controlled by the etch process utilized to form the opening 318.

Figure 3E:
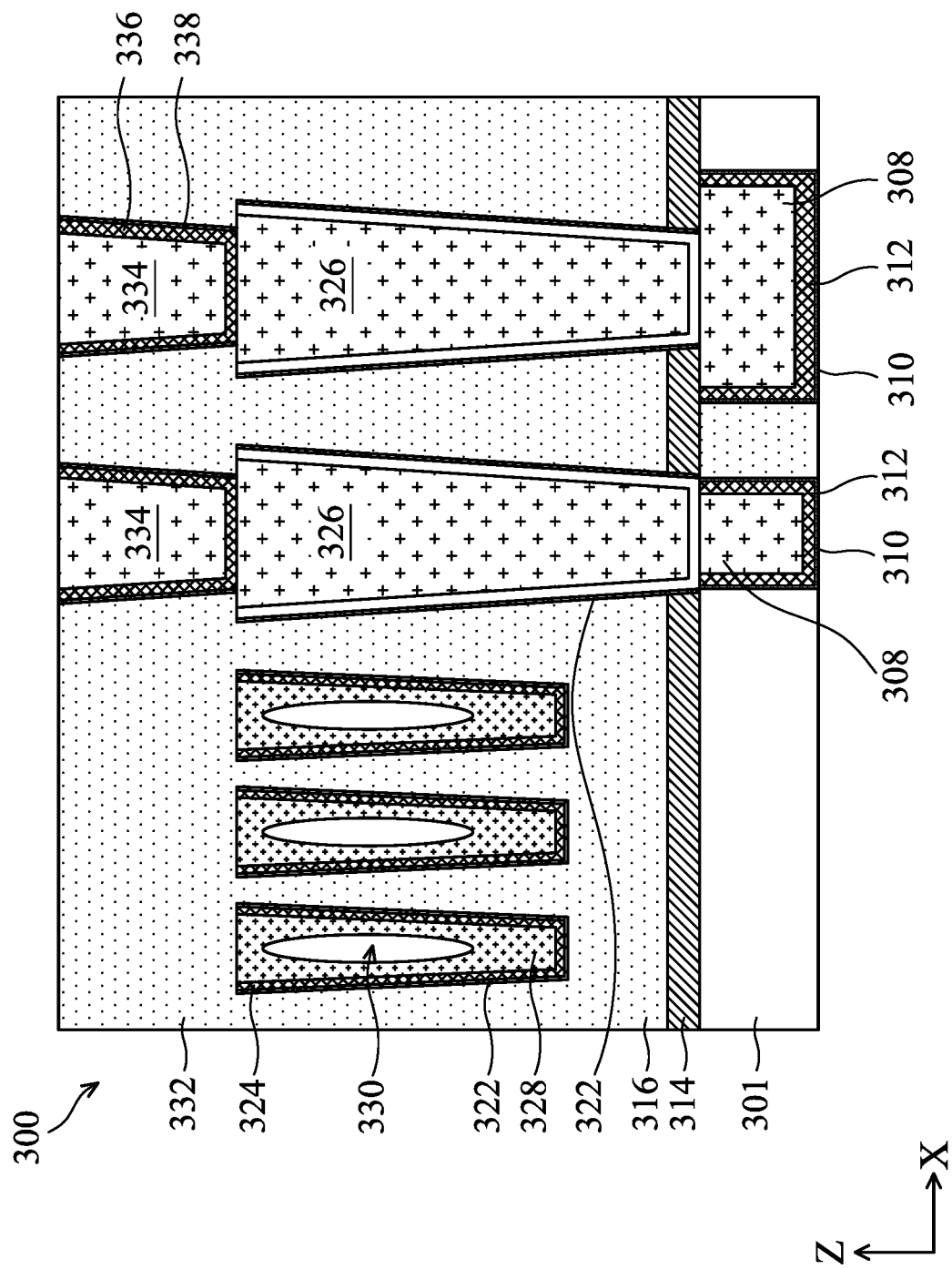

After forming the conductive features 326 and the dummy conductive features 328, a planarization process, such as a chemical mechanical polishing (CMP) process, may be performed to remove the portions of the conductive features 326, dummy conductive features 328, liner 324, and barrier layer 322 formed over the dielectric material 316. The top surfaces of the dummy conductive features 328 and the top surfaces of the conductive features 326 may be substantially co-planar. Next, as shown in FIG. 3E, a dielectric material 332 is formed over the dielectric material 316, the conductive features 326, and the dummy conductive features 328. One or more conductive features 334 may be formed in the dielectric material 332. An etch stop layer (not shown) may be formed between the dielectric material 332 and the dielectric material 316. The dielectric material 332 may include the same material as the dielectric material 316, and the conductive features 334 may include the same material as the conductive features 326. The conductive features 334 may be electrically connected to corresponding conductive features 326. In some embodiments, liners 336 and barrier layers 338 may be formed between the conductive features 334 and the dielectric material 332. As shown in FIG. 3E, the dummy conductive features 328 are embedded in the dielectric materials 316, 332. In other words, the dummy conductive features 328 are surrounded by the dielectric materials 316, 332 and are not in electrically connection with any conductive features or devices.

Figure 4A:
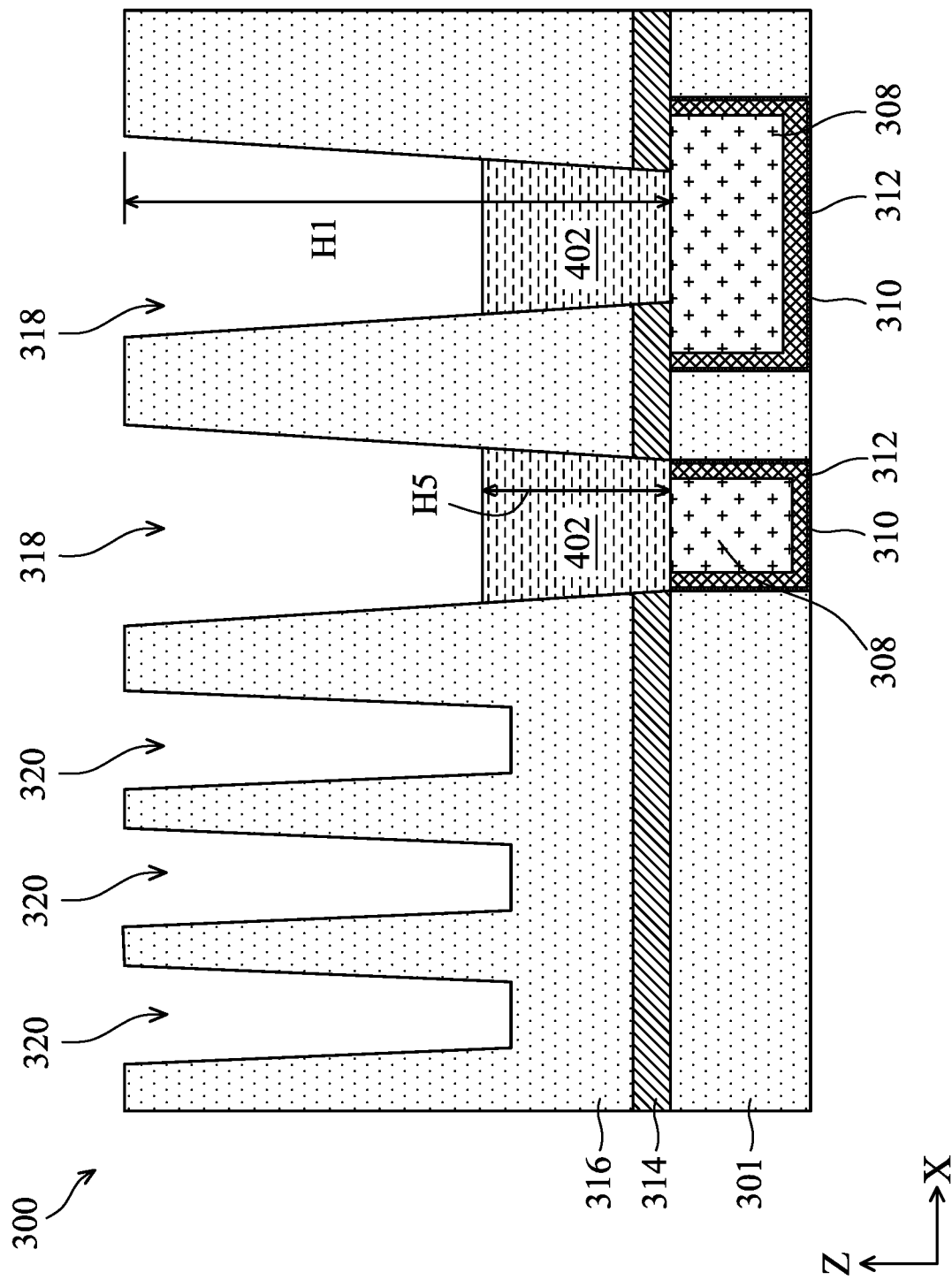
FIGS. 4A-4D are cross-sectional side views of various stages of manufacturing the interconnection structure, in accordance with alternative embodiments.

FIGS. 4A-4D are cross-sectional side views of various stages of manufacturing the interconnection structure 300, in accordance with alternative embodiments. As shown in FIG. 4A, the openings 318, 320 are formed in the dielectric material 316, and the openings 318 have larger dimensions than the openings 320. A conductive material 402 is formed in each opening 318, and the conductive material 402 partially fills each opening 318. The conductive material 402 may include an electrically conductive material, such as Co, Mo, W, Ir, Ru, or Al. Compared to the material of the conductive feature 326 (FIG. 3E), the conductive material 402 has better gap-filling properties. For example, in some embodiments, the conductive feature 326 includes Cu, and the conductive material 402 includes Ru or Co. The conductive material 402 has a height H5 that is about 5 percent to about 95 percent of the height H1.

In some embodiments, the conductive material 402 is selectively formed on the metallic surfaces of the barrier layer 310, the liner 312, and the conductive feature 308. For example, the exposed surfaces of the dielectric material 316 may be first treated with a gas containing hydrophobic functional groups, and the hydrophobic functional groups are formed on the exposed surfaces of the dielectric material 316. The gas containing hydrophobic functional groups does not react with the metallic surfaces of the barrier layer 310, the liner 312, and the conductive feature 308. The hydrophobic functional groups formed on the exposed surfaces of the dielectric material 316 block the conductive material 402 from forming in the openings 320. Thus, the conductive material 402 is selectively formed on the metallic surfaces of the barrier layer 310, the liner 312, and the conductive feature 308 in the openings 318.

Figure 4B:
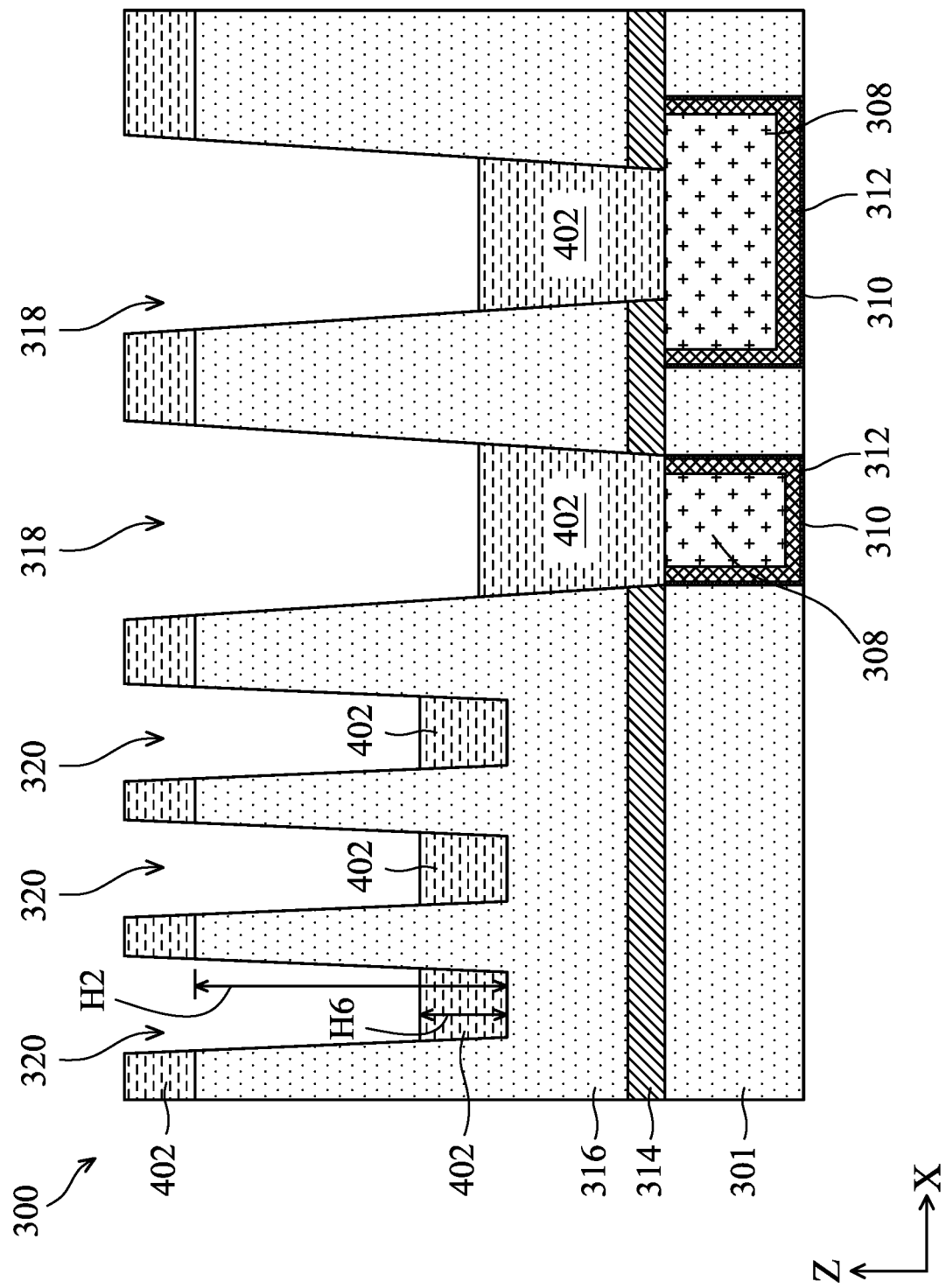

In some embodiments, as shown in FIG. 4B, the conductive material 402 is also formed in the openings 320. The conductive material 402 formed in the openings 320 may have a height H6. In some embodiments, the height H6 is about 5 percent to about 70 percent of the height H2. Because the conductive material 402 has a better gap-fill property than the material of the dummy conductive feature 328, the conductive material 402 may fill the bottom portion of the openings 320, as shown in FIG. 4B. If the height H6 of the conductive material 402 in the openings 320 is greater than about 70 percent of the height H2 of the opening 320, there may not be enough space for forming the air gap 330 (FIG. 4D) in the dummy conductive feature 328 (FIG. 4D). The conductive material 402 may be also formed on the dielectric material 316.

Figure 4C:
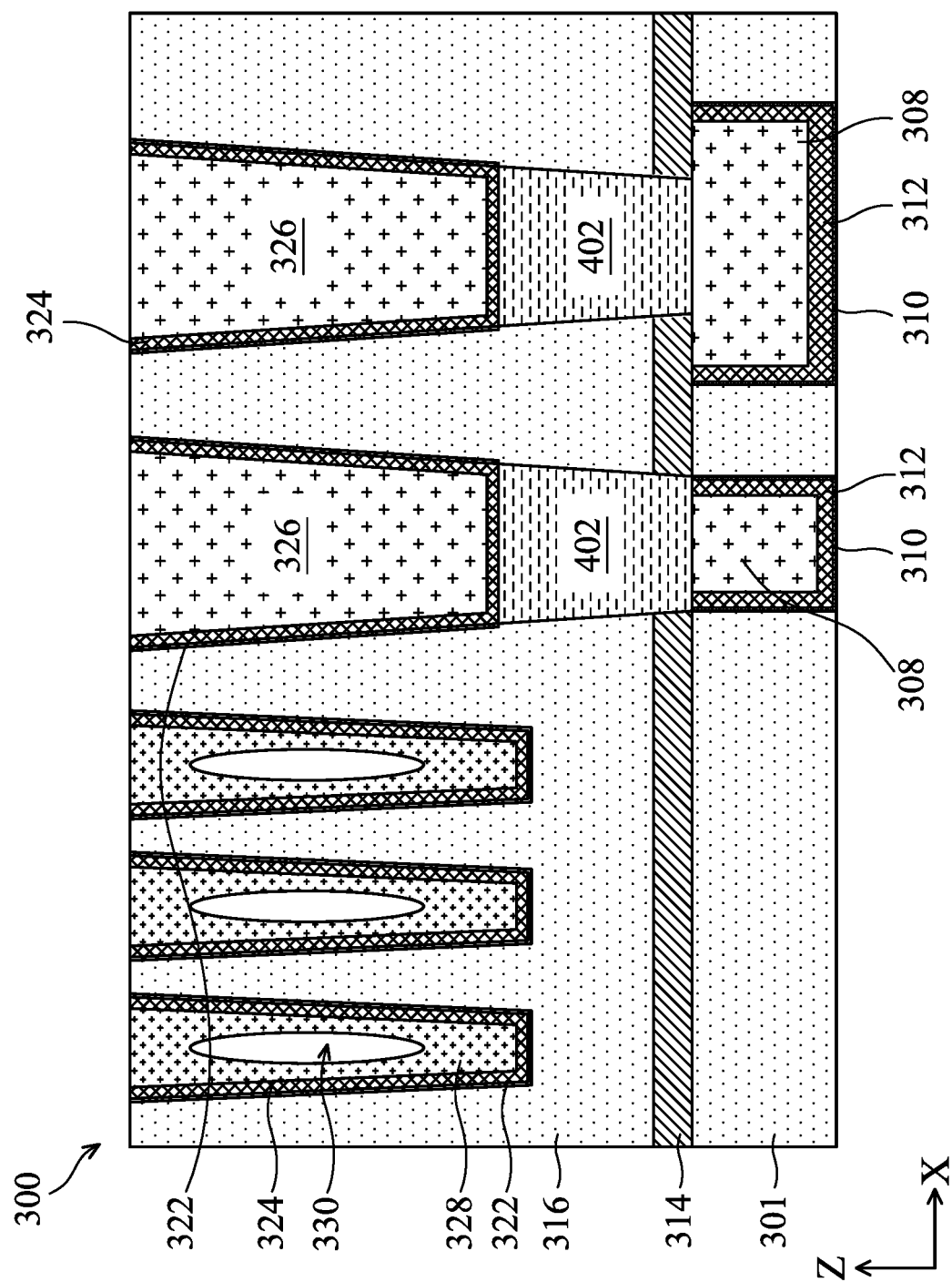
Figure 4D:
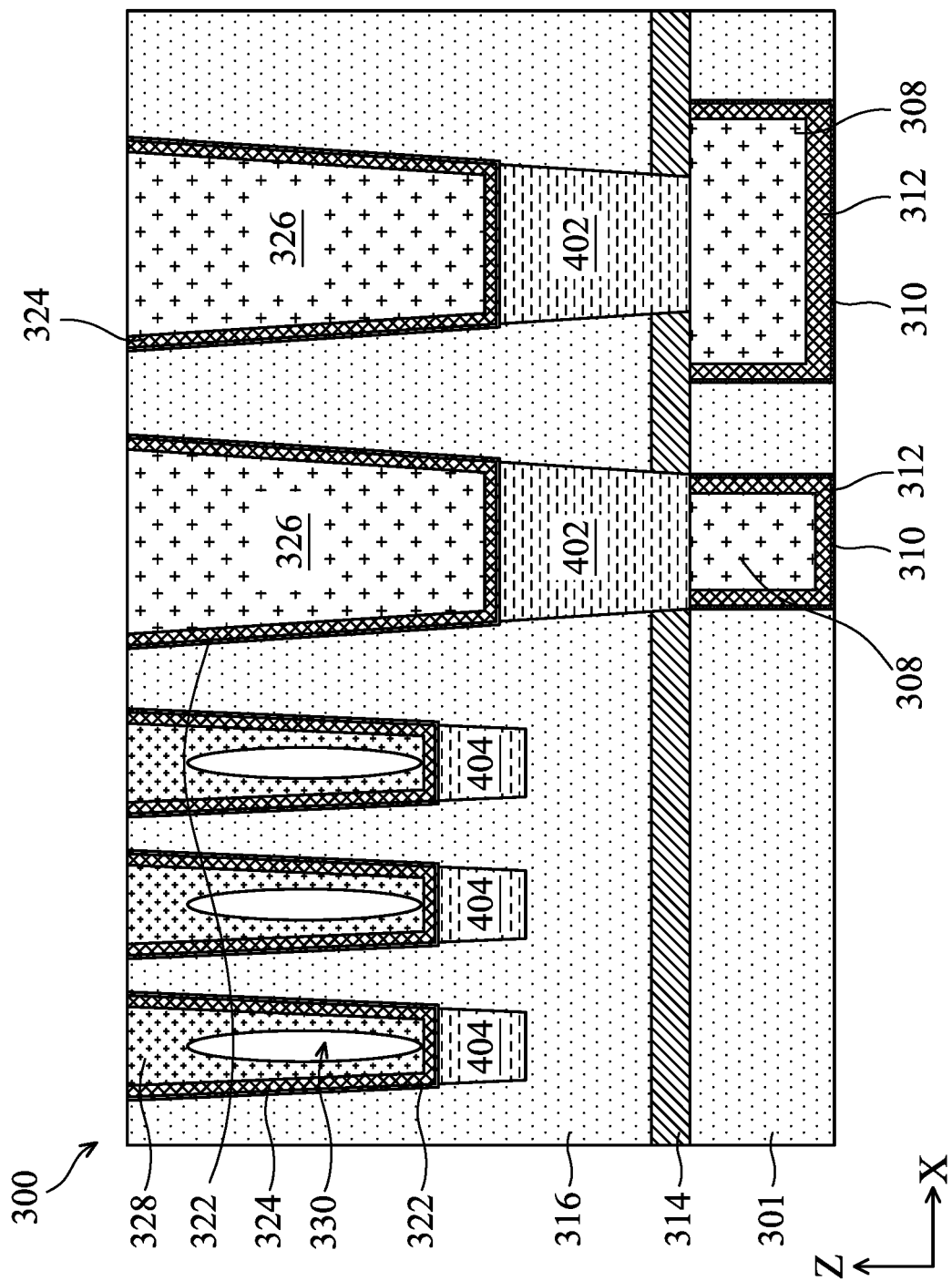

In the embodiment where the conductive material 402 is formed using a selective process, the conductive features 326 are formed over the conductive material 402 in the openings 318, and the dummy conductive features 328 are formed in the openings 320, as shown in FIG. 4C. The barrier layers 322 and the liners 324 may be formed between the conductive features 326 and the dielectric material 316 and between the dummy conductive features 328 and the dielectric material 316. In some embodiments, the barrier layer 322 is not formed on the conductive material 402, and the liner 324 is formed on the conductive material 402. The conductive feature 326 and the conductive material 402 together may be referred to as a conductive feature, such as a conductive line. In some embodiments, additional conductive material different from the material of the conductive feature 326 may be selectively formed on the conductive material 402, and the conductive features 326 are formed over the additional conductive material. Thus, the conductive line may include two or more different conductive materials (not including the materials of the barrier layer 322 and the liner 324), and each conductive material is air-gap free. As shown in FIG. 4C, the interconnection structure 300 may include the dielectric material 316 having one or more conductive features having two or more different solid (i.e., air-gap free) conductive materials and one or more dummy conductive features 328 each having the air gap 330 formed therein formed adjacent the one or more conductive features. A planarization process may be performed to remove the portions of the barrier layer 322, the liner 324, the conductive feature 326, and the dummy conductive feature 328 formed over the dielectric material 316, and the dielectric material 332 (FIG. 3E) may be formed on the planarized surface.

In the embodiment where the conductive material 402 is formed in both the openings 318, 320, the conductive features 326 are formed over the conductive material 402 in the openings 318, and the dummy conductive features 328 are formed over the conductive material 402 in the openings 320, as shown in FIG. 4D. In some embodiments, the barrier layer 322 and the liner 324 may be formed between the conductive features 326 and the dielectric material 316, between the conductive features 326 and the conductive material 402, between the dummy conductive features 328 and the dielectric material 316, and between the dummy conductive features 328 and the conductive material 402. The conductive feature 326 and the conductive material 402 in each opening 318 together may be referred to as a conductive feature, such as a conductive line. In some embodiments, additional conductive material different from the material of the conductive feature 326 may be selectively formed on the conductive material 402, and the conductive features 326 are formed over the additional conductive material. Thus, the conductive line may include two or more different conductive materials (not including the materials of the barrier layer 322 and the liner 324), and each conductive material is air-gap free. The dummy conductive feature 328 and the conductive material 402 in each opening 320 may be referred to as a dummy conductive feature. As shown in FIG. 4D, the interconnection structure 300 may include the dielectric material 316 having one or more conductive features having two or more different solid (i.e., air-gap free) conductive materials and one or more dummy conductive features formed therein formed adjacent the one or more conductive features. The one or more dummy conductive features may include two or more different conductive materials, and at least one of the conductive materials includes the air gap 330 formed therein. A planarization process may be performed to remove the portions of the conductive material 402, the barrier layer 322, the liner 324, the conductive feature 326, and the dummy conductive feature 328 formed over the dielectric material 316, and the dielectric material 332 (FIG. 3E) may be formed on the planarized surface.

Figure 5:
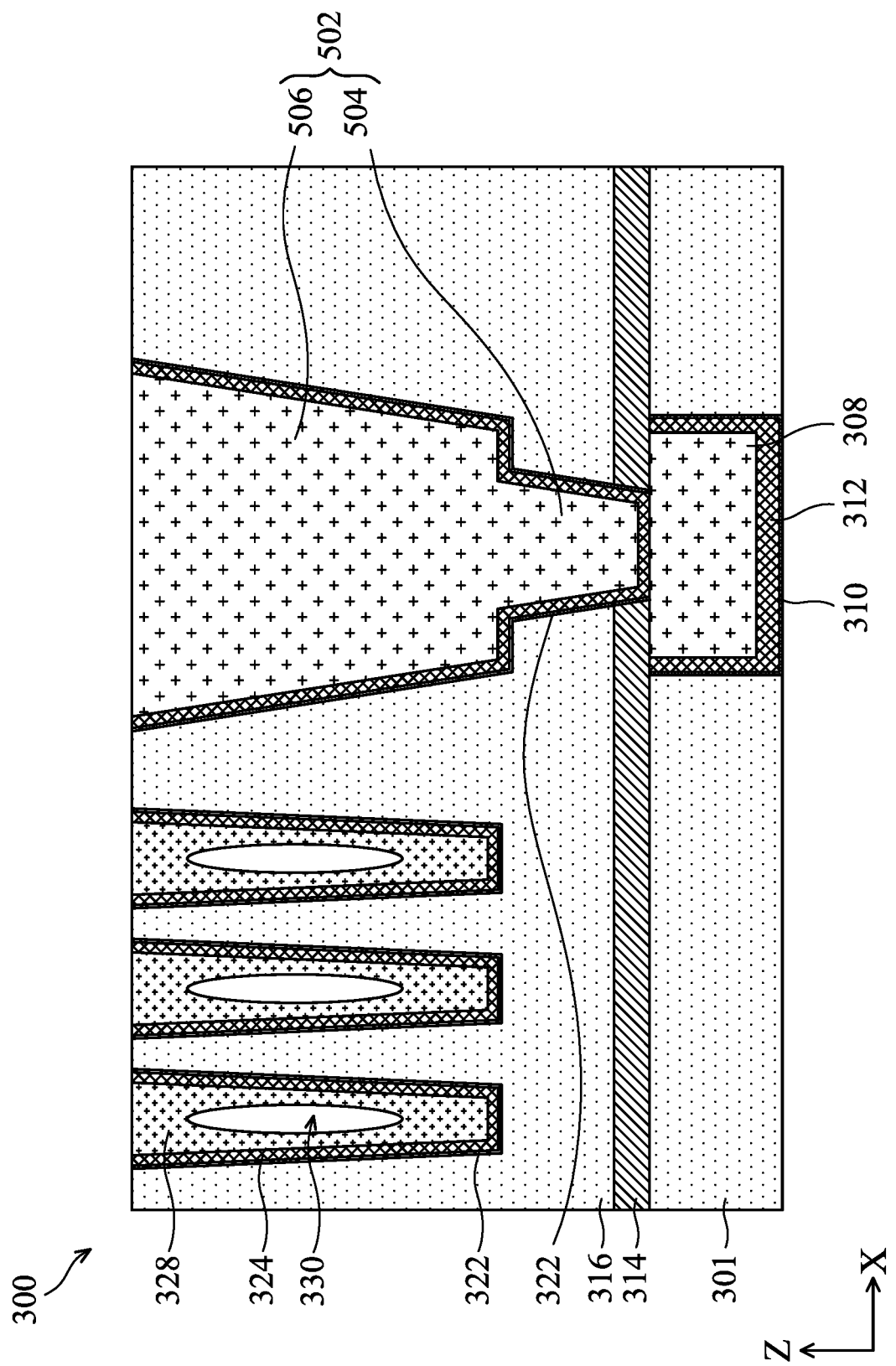
FIG. 5 is a cross-sectional side view of one of various stages of manufacturing the interconnection structure, in accordance with alternative embodiments.

FIG. 5 is a cross-sectional side view of one of various stages of manufacturing the interconnection structure 300, in accordance with alternative embodiments. In some embodiment, the opening 318 (FIG. 3A) is a trench. In some embodiments, the opening 318 (FIG. 3A) includes a trench formed over a via, and a conductive feature 502 is formed in the opening 318. As shown in FIG. 5, the conductive feature 502 includes a first portion 504 and a second portion 506 disposed over the first portion 504. The first portion 504 may be a via and the second portion 506 may be a line. The conductive feature 502 may include the same material as the conductive feature 326 (FIG. 3D) and may be formed by the same process as the conductive feature 326 (FIG. 3D). In some embodiments, the conductive feature 502 includes a solid (i.e., air-gap free) conductive material. The one or more dummy conductive features 328 each having the air gap 330 formed therein may be formed adjacent the conductive feature 502.

Figure 6:
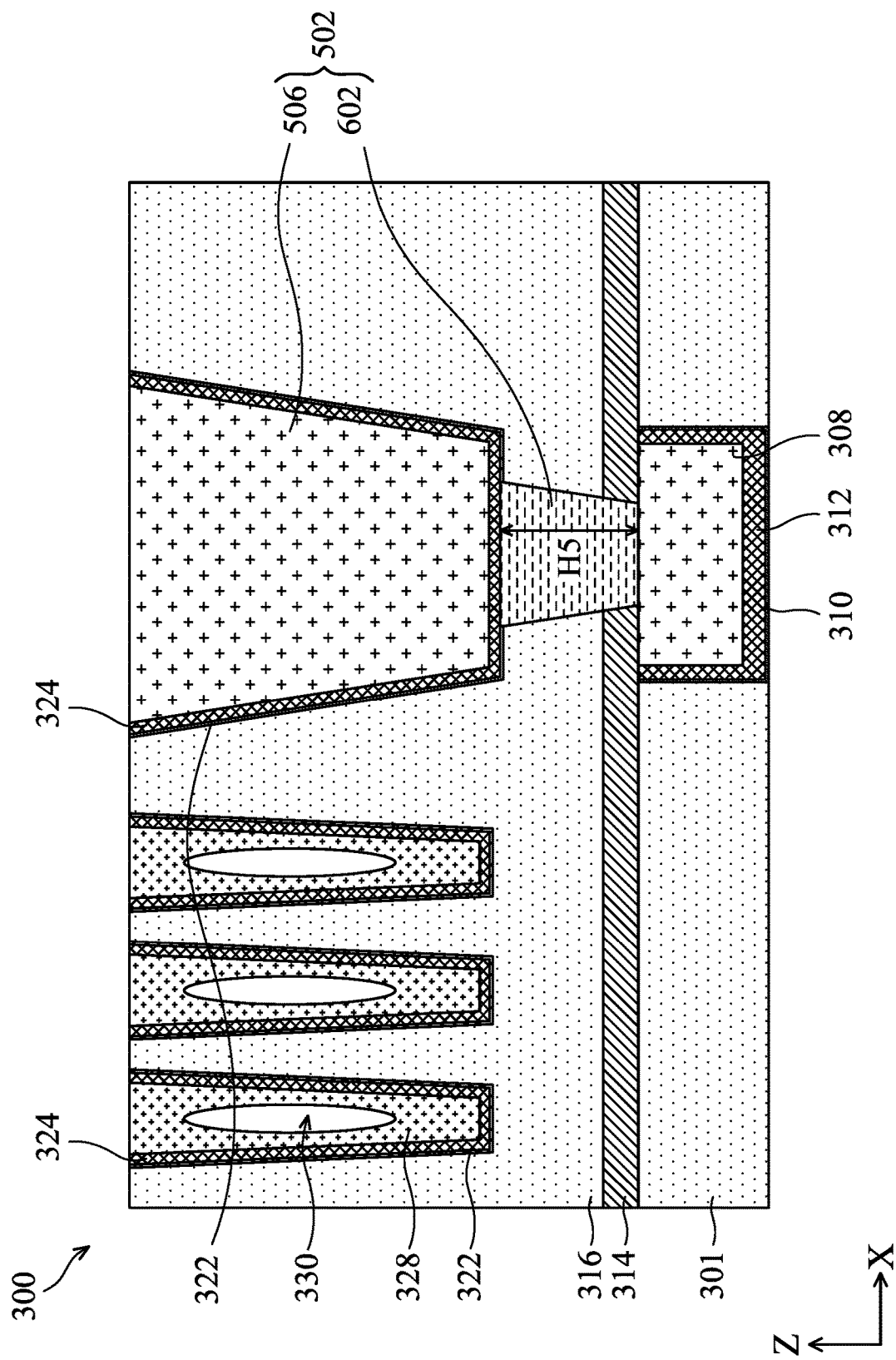
FIG. 6 is a cross-sectional side view of one of various stages of manufacturing the interconnection structure, in accordance with alternative embodiments.

FIG. 6 is a cross-sectional side view of one of various stages of manufacturing the interconnection structure 300, in accordance with alternative embodiments. As shown in FIG. 6, the conductive feature 502 includes a first portion 602 and the second portion 506 disposed over the first portion 602. The first portion 602 may be a via and the second portion 506 may be a line. The first portion 602 of the conductive feature 502 may include the same material as the conductive material 402 (FIG. 4D) and may be formed by the same process as the conductive material 402 (FIG. 4D). The second portion 506 of the conductive feature 502 may include the same material as the conductive feature 326 (FIG. 4D) and may be formed by the same process as the conductive feature 326 (FIG. 4D). The conductive feature 502 may have the height H3 (FIG. 3D). The first portion 602 of the conductive feature 502 may have a height H5 that is about 5 percent to about 95 percent of the height H3 (FIG. 3D). In some embodiments, the conductive feature 502 includes two or more solid (i.e., air-gap free) conductive materials. The one or more dummy conductive features 328 each having the air gap 330 formed therein may be formed adjacent the conductive feature 502.

In some embodiments, the first portion 602 of the conductive feature 502 are selectively formed on the conductive feature 308, so the material of the first portion 602 is not formed in the openings 320 (FIG. 3A). In some embodiments, the material of the first portion 602 of the conductive feature 502 is also formed in the openings 320 (FIG. 3A), and the dummy conductive feature 328 is disposed over the material of the first portion 602 of the conductive feature 502. As a result, a dummy conductive feature includes the material of the first portion 602 of the conductive feature 502 and the dummy conductive feature 328 having the air gap 330 formed therein.

Various embodiments of the present disclosure provide dummy conductive features 328 having the air gap 330 formed therein. The active conductive features 326 formed adjacent the dummy conductive features 328 do not have air gaps formed therein. Some embodiments may achieve advantages. For example, the dummy conductive features 328 having the air gap 330 formed therein can reduce the capacitance. Furthermore, the total capacitance of BEOL may be tuned by purposely forming the air gaps 330 in the dummy conductive features 328.

An embodiment is an interconnection structure. The structure includes a dielectric material and a conductive feature extending through the dielectric material. The conductive feature includes a conductive material and has a first top surface. The structure further includes a dummy conductive feature disposed adjacent the conductive feature in the dielectric material, and the dummy conductive feature has a second top surface substantially co-planar with the first top surface. An air gap is formed in the dummy conductive feature.

Another embodiment is an interconnection structure. The structure includes a first dielectric material and a first conductive feature extending through the first dielectric material. The first conductive feature includes a conductive material. The structure further includes a dummy conductive feature disposed adjacent the first conductive feature in the first dielectric material, and an air gap is formed in the dummy conductive feature. The structure further includes a second dielectric material, and the first dielectric material is disposed over the second dielectric material. The structure further includes a second conductive feature disposed in the second dielectric material, and the first conductive feature is electrically connected to the second conductive feature. The structure further includes a third dielectric material disposed over the first dielectric material, and the dummy conductive feature surrounded by the first and third dielectric materials.

A further embodiment is an interconnection structure. The structure includes a dielectric material and a conductive feature extending through the dielectric material. The conductive feature includes a first conductive material and a second conductive material disposed over the first conductive material, and the second conductive material has a first top surface. The structure further includes a dummy conductive feature disposed adjacent the conductive feature in the dielectric material, and the dummy conductive feature includes a third conductive material having a second top surface. An air gap is formed in the third conductive material of the dummy conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An interconnection structure, comprising:
   a dielectric material;
   a conductive feature extending through the dielectric material, wherein the conductive feature comprises a conductive material and has a first top surface; and
   a dummy conductive feature disposed adjacent the conductive feature in the dielectric material, wherein the dummy conductive feature has a second top surface substantially co-planar with the first top surface, and an air gap is formed in the dummy conductive feature.

2. The interconnection structure of claim 1, further comprising:
   a first barrier layer disposed between the conductive feature and the dielectric material; and
   a second barrier layer disposed between the dummy conductive feature and the dielectric material.

3. The interconnection structure of claim 2, further comprising:
   a first liner disposed between the conductive feature and the first barrier layer; and
   a second liner disposed between the dummy conductive feature and the second barrier layer.

4. The interconnection structure of claim 1, wherein the conductive feature has a first top width, and the dummy conductive feature has a second top width substantially less than the first top width.

5. The interconnection structure of claim 4, wherein the second top width is about 10 percent to about 50 percent of the first top width.

6. The interconnection structure of claim 4, wherein the conductive feature has a first height, and the dummy conductive feature has a second height substantially less than the first height.

7. The interconnection structure of claim 6, wherein the second height is about 50 percent to about 85 percent of the first height.

8. An interconnection structure, comprising:
   a first dielectric material;
   a first conductive feature extending through the first dielectric material, wherein the first conductive feature comprises a conductive material;

a dummy conductive feature disposed adjacent the first conductive feature in the first dielectric material, wherein an air gap is formed in the dummy conductive feature;

a second dielectric material, wherein the first dielectric material is disposed over the second dielectric material;

a second conductive feature disposed in the second dielectric material, wherein the first conductive feature is electrically connected to the second conductive feature; and a third dielectric material disposed over the first dielectric material, wherein the dummy conductive feature surrounded by the first and third dielectric materials.

9. The interconnection structure of claim 8, further comprising third conductive feature disposed in the third dielectric material, wherein the third conductive feature is electrically connected to the first conductive feature.

10. The interconnection structure of claim 9, further comprising an etch stop layer disposed between the first dielectric material and the second dielectric material.

11. The interconnection structure of claim 10, wherein the first conductive feature extends through the etch stop layer.

12. The interconnection structure of claim 11, further comprising a liner in contact with the first conductive feature.

13. The interconnection structure of claim 12, further comprising a barrier layer in contact with the liner.

14. The interconnection structure of claim 13, wherein the liner is in contact with the second conductive feature.

15. The interconnection structure of claim 13, wherein the barrier layer is in contact with the second conductive feature.

16. An interconnection structure, comprising:

a dielectric material;

a conductive feature extending through the dielectric material, wherein the conductive feature comprises a first conductive material and a second conductive material disposed over the first conductive material, wherein the second conductive material has a first top surface; and a dummy conductive feature disposed adjacent the conductive feature in the dielectric material, wherein the dummy conductive feature comprises a third conductive material having a second top surface, and an air gap is formed in the third conductive material of the dummy conductive feature.

17. The interconnection structure of claim 16, wherein the first conductive material and the second conductive material comprise different conductive materials, and the first top surface is substantially co-planar with the second top surface.

18. The interconnection structure of claim 17, wherein the first conductive material comprises Co or Ru, and the second conductive material comprises Cu.

19. The interconnection structure of claim 16, wherein the dummy conductive feature further comprises a fourth conductive material, wherein the third conductive material is disposed over the fourth conductive material.

20. The interconnection structure of claim 19, wherein the second conductive material and the third conductive material comprise a same material, and the first conductive material and the fourth conductive material comprise a same material.

* * * * *